United States Patent
Katayama

(10) Patent No.: US 7,339,231 B2
(45) Date of Patent: Mar. 4, 2008

(54) SEMICONDUCTOR DEVICE AND AN INTEGRATED CIRCUIT CARD

(75) Inventor: Kozo Katayama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/195,683

(22) Filed: Aug. 3, 2005

(65) Prior Publication Data

US 2006/0050558 A1 Mar. 9, 2006

(30) Foreign Application Priority Data

Sep. 15, 2004 (JP) .............................. 2004-268618

(51) Int. Cl.
*H01L 29/788* (2006.01)

(52) U.S. Cl. ...................... 257/317; 257/206; 257/207; 257/208; 257/209; 257/314; 257/315; 257/390; 257/391; 257/E27.103; 257/E29.129; 365/185.01; 365/185.05; 365/185.26

(58) Field of Classification Search ........ 257/206–209, 257/314, 315, 390, 391, E27.103, E29.129, 257/324, E29.309, 317; 365/185.01, 185.05, 365/185.26

See application file for complete search history.

(56) References Cited

U.S. PATENT DOCUMENTS 7,045,848 B2 * 5/2006 Shukuri ...................... 257/311

FOREIGN PATENT DOCUMENTS

WO 2004/023385 3/2004

* cited by examiner

*Primary Examiner*—Sue A. Purvis
*Assistant Examiner*—Benjamin Tzu-Hung Liu
(74) *Attorney, Agent, or Firm*—Miles & Stockbridge, P.C.

(57) ABSTRACT

There is provided a technology capable of enhancing reliability in rewrite of storage information in a nonvolatile memory while checking an increase in area of a memory array thereof. With a memory array configuration, individual bit lines are connected to two memory cells sharing a source, and disposed at symmetrical positions, respectively, and two lengths of metal interconnections (the bit lines) are disposed with respect to a width in the direction of a channel width of a region occupied by one of the memory cells. In contrast, respective control gates of the memory cells corresponding to two word are rendered at an identical potential, and respective memory gates thereof are rendered at an identical potential, thereby disposing three lengths of metal interconnections (a control gate control line, memory gate control line, and common source line) with respect to a length of the regions occupied by the two memory cells in the direction of a channel length.

20 Claims, 16 Drawing Sheets

ROW DIRECTION

COLUMN DIRECTION

1 PAGE

SEMICONDUCTOR DEVICE AND AN INTEGRATED CIRCUIT CARD

CROSS-REFERENCE TO RELATED APPLICATION

The present application claims priority from Japanese patent application No. 2004-268618 filed on Sep. 15, 2004, the content of which is hereby incorporated by reference in this application.

BACKGROUND OF THE INVENTION

The invention relates to a semiconductor device, and in particular, to a technology effective for application to a semiconductor device mounted in an IC (integrated circuit) card, and so forth, such as, for example, a nonvolatile memory that is electrically rewritable.

The nonvolatile memory capable of electrically writing and erasing storage information, in such a state as assembled over, for example, a printed wiring board, can rewrite storage information, and can hold the storage information even without supply of power from outside, so that the same has been in widespread use for various products requiring a memory, such as a memory card mounted in a digital camera, or a home game player, and so forth, or a memory of BIOS (Basic Input/output System) of a personal computer, and so forth.

As the nonvolatile memory, there have been proposed an EEPROM (Electrically Erasable and Programmable Read Only Memory) capable of erasing, and newly writing storage information in units of, for example, a byte, or in units of a page (for example, 32 to 128 bytes), a flash memory capable of erasing, and newly writing storage information in relatively large units of, for example, a block, and so forth.

In, for example, PCT WO 2004/023385 Pamphlet, there has been disclosed a semiconductor processing device comprising a first nonvolatile memory for erasing storage information in units of a first data length, a second nonvolatile memory for erasing storage information in units of a second data length, and a central processing unit, thereby capable of executing input/output of encrypted data with outside (Patent Document 1).

(Patent Document 1) PCT WO 2004/023385 Pamphlet

SUMMARY OF THE INVENTION

In order to meet wishes for further miniaturization of a nonvolatile memory, or ease of operation therewith, efforts for various developments have been underway. To meet a wish for erasing storage information corresponding to, for example, a data length in a necessary processing unit, rewrite of storage information in units of 1 byte (for example, 8 bits) has been adopted. For example, with the semiconductor processing device disclosed in Patent Document 1 described as above, a flash memory is used for storage of programs to be processed by the central processing unit, and an EEPROM is used for storage of an encryption key for use in encryption of data, thereby specifying respective data lengths as erase units of storage information for the respective memories. That is, with the flash memory, writing is executed in units of a word line, such as in units of 1024 bits, erasing is executed in units of a block in a single or a plurality of word lines, and reading is executed in units of 32 bits while with the EEPROM, reading is executed in units of 32 bits, and writing/erasing are executed in units of 8 bits, respectively. By so doing, it is possible to achieve higher efficiency in erasing storage information prior to execution of processing for writing of the programs, and to rewrite storage information according to the data length (for example, in units of 8 bits) of the required unit of processing in write processing for the encryption key, and so forth to be used in processing by the CPU (Central Processing Unit).

However, there exist such various technical problems as described hereinafter with rewrite of storage information in the nonvolatile memory. For example, if rewrite of storage information in the nonvolatile memory is repeated, this will cause a decrease in read current at the time of reading the storage information. The decrease in the read current can be compensated for by widening a channel width of a memory cell (a unit structure or unit circuit, for storing information in units of 1 bit), however, by doing so, a cell size becomes relatively large, resulting in an increase in an area of a memory array (the memory cells arranged in a two-dimensional grid pattern).

Further, for implementing the rewrite of the storage information in units of 1 byte as described in the foregoing, it is necessary to connect switching elements for dividing respective bit lines (common metal interconnections in the memory array, each connected to a plurality of the memory cells, for sending and receiving signals) by the byte, and separating the memory cells by the data length in units of 1 byte, so that there will remain a problem that an area of the memory array becomes relatively large. Since an increase in the area of the memory array results in enlargement in area of a product where the nonvolatile memory is mounted, such as, for example, a microcomputer, such an increase blocks miniaturization of the product.

It is therefore an object of the invention to provide a technology capable of checking an increase in area of a memory array of a nonvolatile memory, and enhancing reliability in rewrite of storage information.

Another object of the invention is to a technology capable of implementing rewrite of storage information in units of 1 byte without causing an increase in area of a memory array of a nonvolatile memory.

The above and other objects, features and advantages of the present invention will be apparent from the following description in the present specification in conjunction with the accompanying drawings.

The overview of a representative one of embodiments of the invention, disclosed in the present application for patent, is simply described as follows.

A semiconductor device according to the invention comprises: first memory cells and second memory cells, sharing a source, respectively, adjacent to each other, and disposed at symmetrical positions along a first direction; bit lines individually and electrically connected to respective drains of the first memory cells and respective drains of the second memory cells, respectively; and a gate of the first memory cell and a gate of the second memory cell identical in potential to each other.

An IC card according to the invention has a nonvolatile memory comprising: first memory cells and second memory cells, sharing a source, respectively, adjacent to each other, and disposed at symmetrical positions along a first direction; bit lines individually and electrically connected to the first memory cells and the second memory cells, respectively; a gate of the first memory cell and a gate of the second memory cell being identical in potential to each other; a central processing unit; and terminals or an antenna for executing input/output of data with outside.

Advantageous effects obtained by the representative one of the embodiments of the invention, disclosed in the present application for patent, is simply described as follows.

With the nonvolatile memory, it is possible to enhance reliability in rewriting storage information while checking an increase in memory array area. Further, with the nonvolatile memory, rewrite of storage information in units of 1 byte can be implemented without causing an increase in memory array area.

DETAILED DESCRIPTION OF THE PREFERRED EMBODIMENTS

Figure 1:
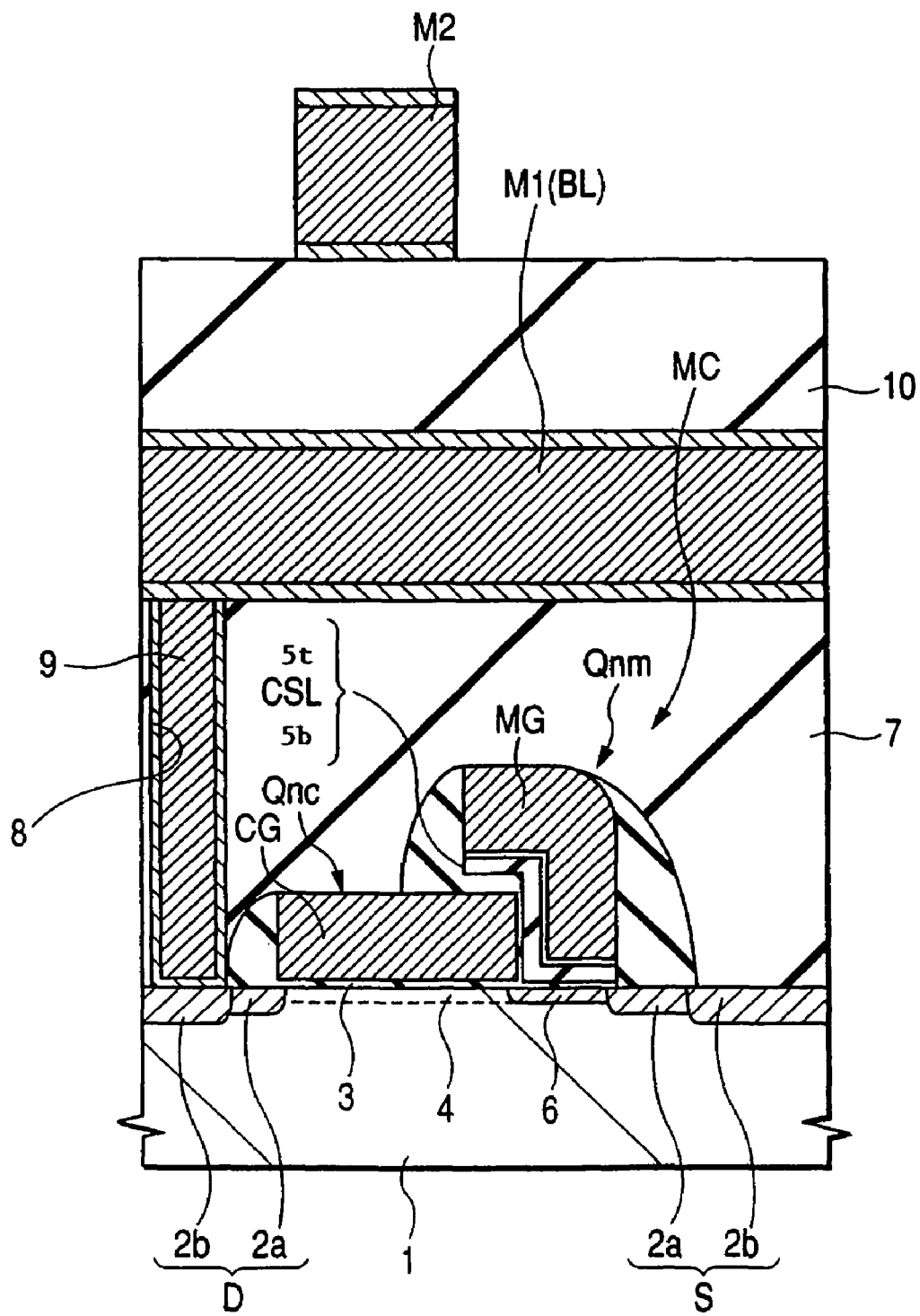
FIG. 1 is an example of a sectional view showing the principal part of a nonvolatile memory cell adopted in a flash memory according to Embodiment 1.

Embodiments of the invention will be described in detail hereinafter with reference to the accompanying drawings. The embodiments of the invention described hereinafter each will be divided into a plurality of sections or forms as necessary for convenience in description, however, it is to be understood that those are not unrelated to each other unless explicitly described otherwise, and that one thereof represents part or whole of a variation, details, supplementary explanation, and so forth, of the others. Further, in the case where reference is made to the number and so forth (including the number of pieces, numerical values, ranges, and so on) of elements in the description of the following embodiments, the number and so forth are not limited to specified numbers, but may be not less than, or not more than the specified numbers unless explicitly described otherwise, or obviously limited to the specified numbers on the basis of the underlying principle. Still further, it goes without saying that constituent elements (including element steps, and so on) in the description of the following embodiments are not necessarily essential unless explicitly described otherwise, or those are obviously essential on the basis of the underlying principle. Similarly, in the case where reference is made to shapes and positional relationship, and so forth, with reference to the constituent elements, and so forth in the description of the following embodiments, it is to be understood that those, in effect, approximate to, or analogous to the shapes, and so forth are included in the scope of the invention. The same applies to the numerical values, and the ranges, as described above.

Furthermore, in all the drawings referred to in description of the present embodiment, identical members are in principle denoted by like reference numerals, omitting repeated explanation. In the following embodiments, MIS.FET (Metal Insulator Semiconductor Field Effect Transistor) representing a field effect transistor is abbreviated as a MIS, and an n-channel MIS.FET is abbreviated as nMIS. Further, needless to say, the term "silicon nitride" refers to $Si_3N_4$, but the term is to include not only that, but also an insulating film of silicon nitride of composition analogous thereto, and similarly, needless to say, a term "silicon oxide" refers to $SiO_2$, but the term is to include not only that, but also an insulating film of silicon oxide of composition analogous thereto.

Embodiment 1

FIG. 1 shows an example of a nonvolatile memory cell adopted in a flash memory according to Embodiment 1. In the figure, there is shown, by way of example, a split gate type memory cell of a MONOS (Metal Oxide Nitride Semiconductor) structure provided with two transistors each having a control gate, or a memory gate, and FIG. 1 is a sectional view showing the principal part of the memory cell, cut along the direction of a channel length.

A memory cell MC is formed in an active region surrounded by isolation parts on the top surface (a device forming face) of a substrate 1 made of, for example, p-type single crystal silicon, having two transistors consisting of a memory cell select n MIS.FET (referred to merely as "select n MIS" hereinafter) Qnc, and a memory n MIS.FET (referred to merely as "memory n MIS" hereinafter) Qnm. A drain D and a source S of the memory cell MC are of the so-called LDD (Lightly Doped Drain) structure having, for example, an $n^-$type semiconductor region $2a$, and an $n^+$type semiconductor region $2b$ higher in impurity concentration than the semiconductor region $2a$. The $n^-$type semiconductor region $2a$ is disposed on a side of the memory cell MC, adjacent to a channel thereof while the $n^+$type semiconductor region $2b$ is disposed at a position away from the channel by a distance corresponding to the $n^-$type semiconductor region $2a$.

A control gate CG of the select n MIS Qnc, and a memory gate MG of the memory n MIS Qnm are disposed between the drain D and the source S over the top surface of the substrate 1 so as to run along the direction of a channel width, respectively, and a plurality of the memory cells MC are adjacent to each other along the direction of the channel width through the intermediary of the respective isolation parts formed over the top surface of the substrate 1. The control gate CG, and the memory gates MG are made of, for example, n-type polycrystalline silicon of low resistance, and the control gate CG has a gate length on the order of, for example, 0.2 µm while the memory gate MG has a gate length on the order of, for example, 0.1 µm.

A gate insulator 3 made of a thin silicon oxide film on the order of, for example, 2 to 3 nm in thickness is provided between the control gate CG, and the substrate 1. Accordingly, the control gate CG in common with a plurality of the memory cells MC is disposed over the isolation parts, and portions of the substrate 1, through the intermediary of the gate insulator 3. A p-type semiconductor region 4 for adjusting a threshold voltage of the select n MIS Qnc is formed in portions of the substrate 1, underneath the gate insulator 3. The p-type semiconductor region 4 is doped with, for example, boron.

Meanwhile, a portion of the memory gate MG overlies the control gate CG, and insulation between the control gate CG, and the memory gate MG is implemented with insulating films 5b, 5t, provided on the top face and side face of the control gate CG, respectively, a charge storage layer CSL, and so on. Further, the memory gate MG in common with the plurality of the memory cells MC is disposed over portions of the substrate 1 through the intermediary of the insulating films 5b, 5t and the charge storage layer CSL. An n-type semiconductor region 6 for adjusting a threshold voltage of the memory n MIS Qnm is formed in portions of the substrate 1, underneath the insulating film 5b. The n-type semiconductor region 6 is doped with, for example, arsenic or phosphorous.

The charge storage layer CSL is provided in such a state as sandwiched between the insulating films 5b, 5t, disposed below and above, respectively, and is made of, for example, silicon nitride, being not more than 50 nm in thickness. The insulating films 5b, 5t each are made of, for example, silicon oxide, and the insulating film 5b has a thickness in the range of, for example, about 4 to 5 nm while the insulating film 5t has a thickness on the order of, for example, 6 nm. The insulating film 5t may be formed of silicon nitride (SiON). Further, the insulating films 5b, 5t each can be made up of a silicon oxide film containing nitrogen.

The select n MIS Qnc and the memory n MIS Qnm are covered with an insulating film 7, and a metal interconnection M1 in a first layer is formed over the insulating film 7. A contact hole 8 reaching the drain D is formed in the insulating film 7 and the drain D is electrically connected to the metal interconnection M1 in the first layer through the intermediary of a plug 9 embedded in the contact hole 8. The metal interconnection M1 is one of signal lines running along a row direction in a memory array where the memory cells are arranged in a two-dimensional grid pattern, functioning as, for example, a bit line BL. Further, over the metal interconnection M1 in the first layer, there is formed a metal interconnection M2 in a second layer through the intermediary of an insulating film 10. The metal interconnection M2 is one of signal lines running along a column direction crossing the row direction at right angles, in the memory array, to be electrically connected to, for example, the control gates CG, or the memory gates MG, functioning as a gate control line.

Figure 2:
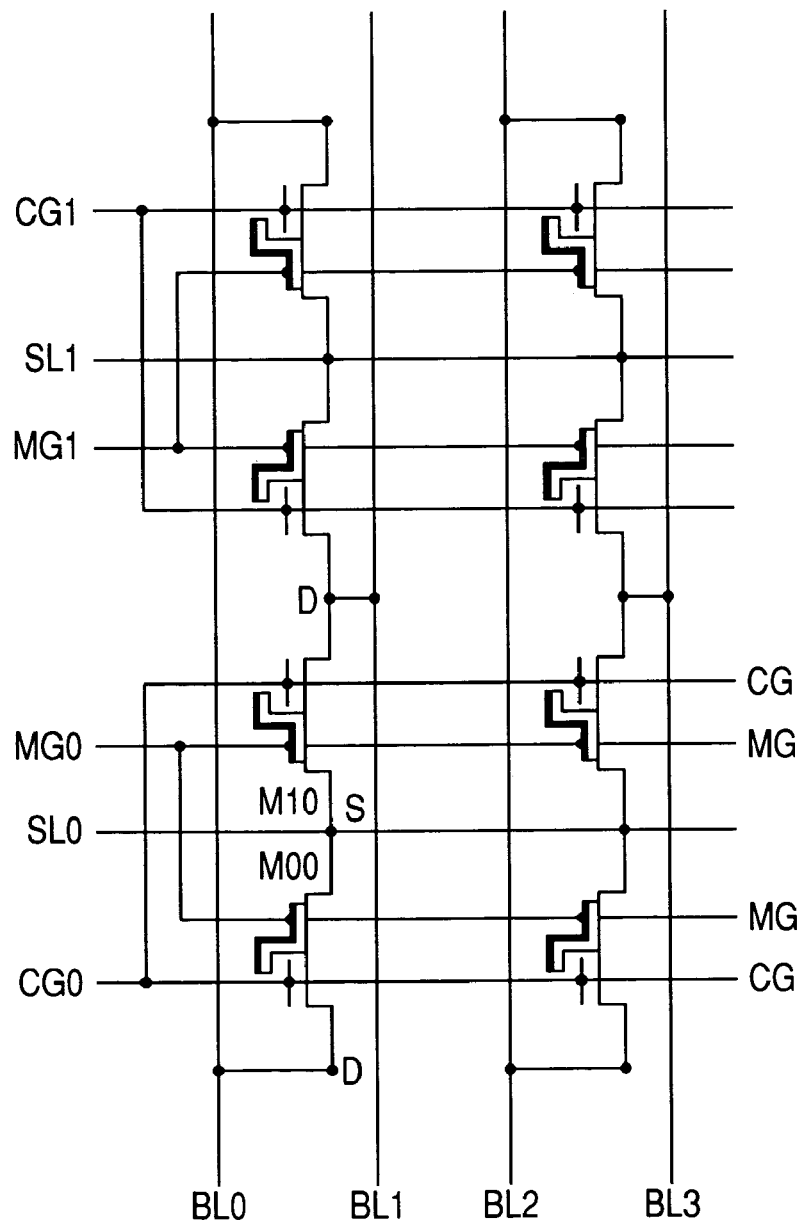
FIG. 2 is an example of a circuit diagram of a NOR memory array in the case of making up the flash memory by use of the nonvolatile memory shown FIG. 1.
Figure 3:
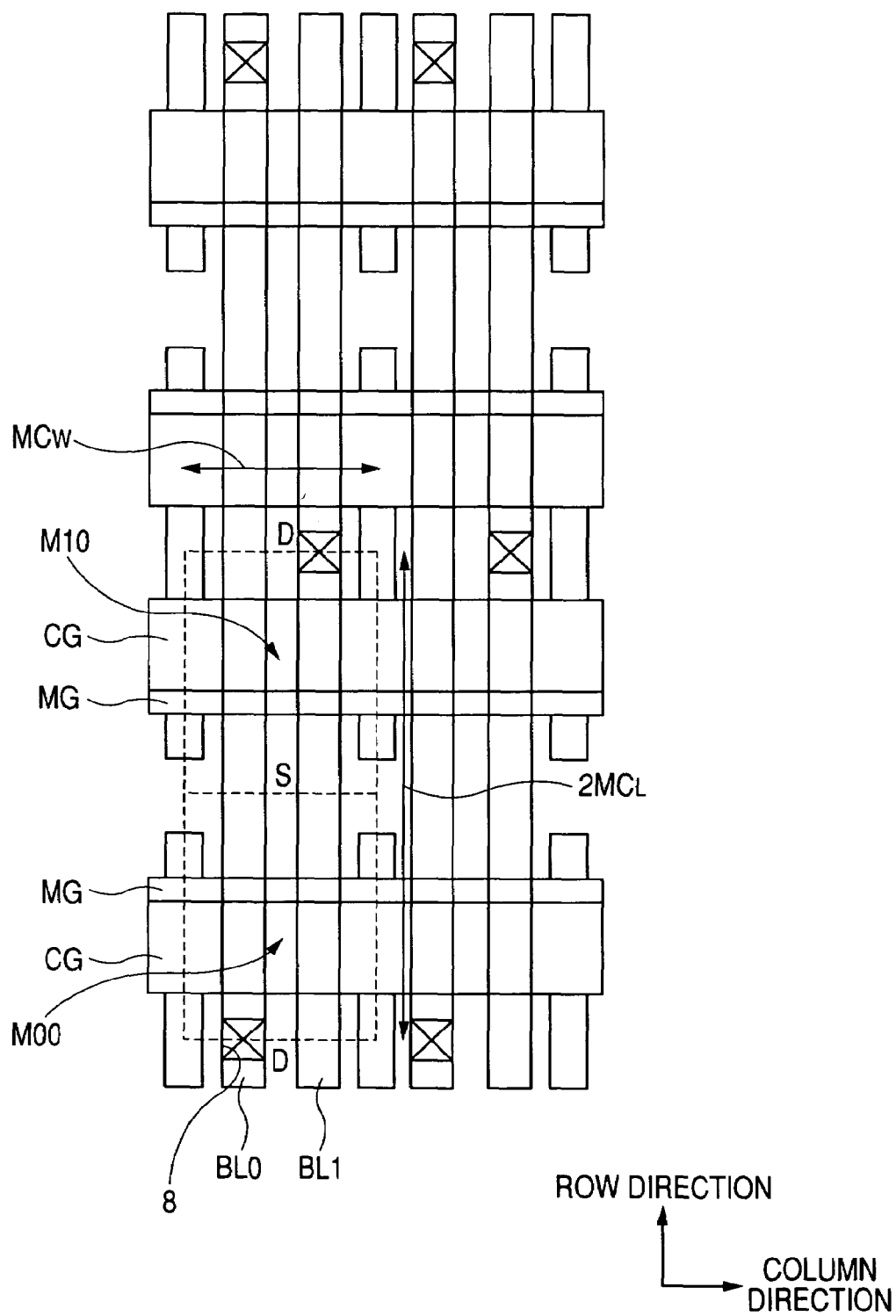
FIG. 3 is an example of a plane layout view of the NOR memory array according to Embodiment 1.

FIG. 2 shows an example of a circuit diagram of a NOR memory array making up the flash memory according to Embodiment 1, and FIG. 3 shows an example of a plane layout view of the NOR memory array. Herein, a memory array configuration is described in detail by taking two memory cells M00, M10, sharing a source, as an example, however, the same applies to two memory cells sharing a source, other than the two memory cells M00, M10.

With the memory array configuration according to Embodiment 1, individual bit lines BL0 and BL1 are connected to the two memory cells M00, M10, sharing a source S, and disposed at symmetrical positions, respectively. More specifically, the drain D of the memory cell M00 is connected to the bit line BL0, and the drain D of the memory cell M10 is connected to the bit line BL1, whereupon two lengths of metal interconnections (the bit lines BL0 and BL1) are disposed with respect to a width (hereinafter referred to merely as a cell width) $MC_w$ in the direction of a channel width (the column direction) of a region (one region delineated by a dotted line in FIG. 3) occupied by one of the memory cells M00 (or the memory cell M10).

In contrast, the respective control gates CG of the memory cell M00 and the memory cell M10, corresponding to two word, are connected to a control gate control line CG0 running along the direction of the channel width to be rendered at an identical potential, the respective memory gates MG thereof are connected to a memory gate control line MG0 running along the direction of the channel width to be rendered at an identical potential, and the source S thereof is connected to a common source line SL0 to be rendered at an identical potential. As a result, three lengths of metal interconnections (the control gate control line CG0, the memory gate control line MG0, and the common source line SL0) are disposed with respect to a length twice a length (hereinafter referred to merely as a cell length) $MC_L$ of the region (one region delineated by the dotted line in FIG. 3) occupied by one of the memory cell, M00 (or the memory cell M10), in the direction of a channel length (the row direction). It therefore follows that with the conventional technology, two lengths of metal interconnections have been required for supply of power to the respective control gates CG of the two memory cells M00, M10, sharing the source S, and disposed at the symmetrical positions, however, with Embodiment 1, this can be implemented with the use of one length of the metal interconnection.

The cell width $MC_w$ is restricted to a width corresponding to twice a pitch of the metal interconnections as a result of disposing the two lengths of the metal interconnections with respect to the cell width $MC_w$, however, the bit line BL0 for the memory cell M00, and the bit line BL1 for the memory cell M10 are separated from each other, thereby enabling storage information to be concurrently read, so that the control gate control line CG0 can be shared. As a result, even in the case where the control gates CG, the memory gates MG, and the source S need be shunted by use of a metal interconnection, respectively, the cell length $MC_L$ can be reduced to 1.5 times the minimum pitch of the metal interconnections.

Figure 4:
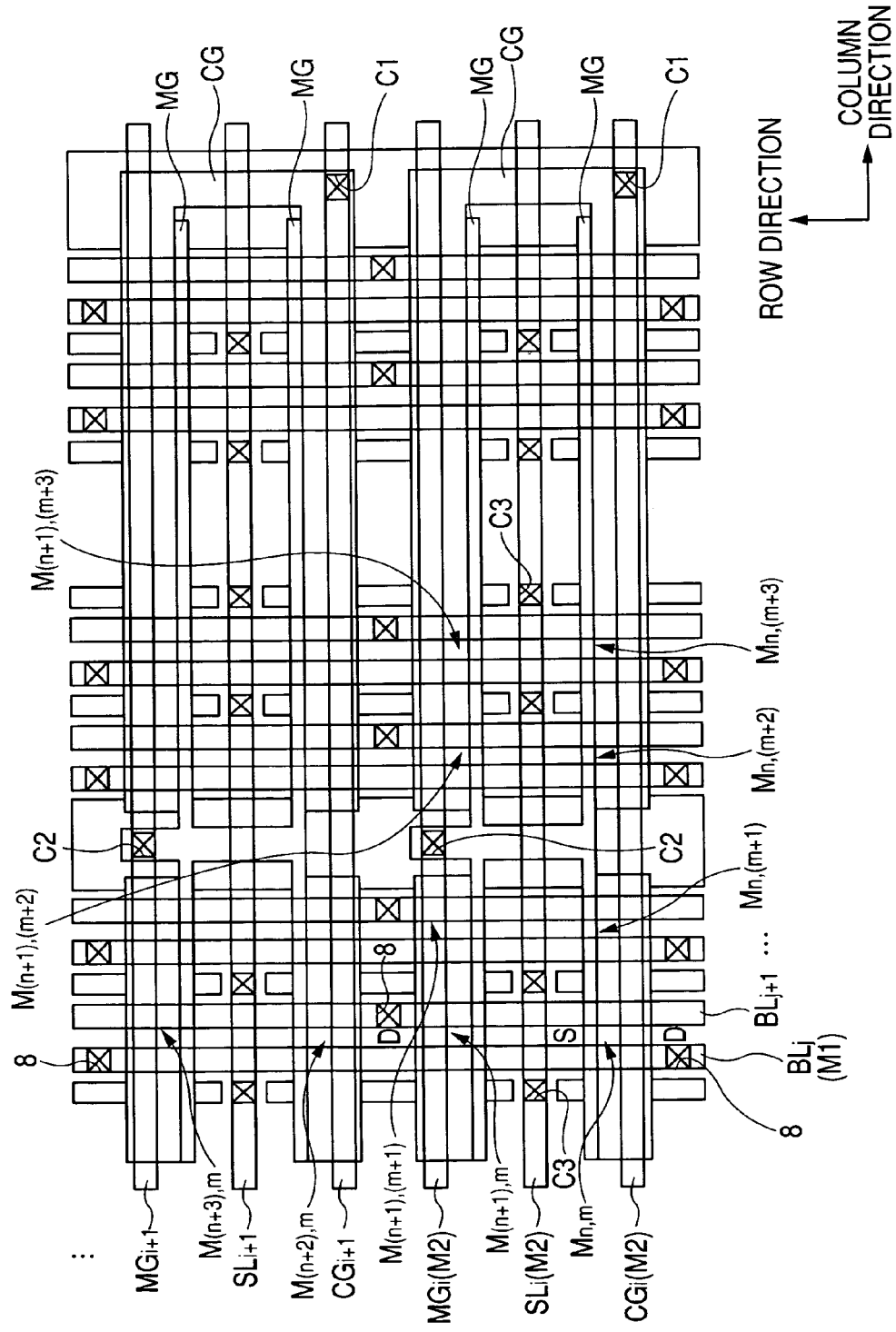
FIG. 4 is another example of the plane layout view of the NOR memory array according to Embodiment 1.

FIG. 4 shows an example of a plane layout view of the NOR memory array wherein the bit lines are made up of the metal interconnection in the first layer, respectively, while gate control lines and common source lines are made up of the metal interconnection in the second layer, respectively.

The metal interconnection M1 in the first layer run along the direction of the channel length, thereby making up the bit lines $BL_j$, $BL_{j+1}$, . . . , respectively. Two lengths of the bit lines adjacent to each other (for example, $BL_j$, $BL_{j+1}$, . . . ,) are mutually and alternately connected to the respective drains D of two adjacent memory cells (for example, the memory cells $M_{n, m}$ and $M_{(n+1), m}$, the memory cells $M_{(n+2), m}$, and $M_{(n+3), m}$, . . . ,) disposed along the direction of the channel length through the intermediary of the contact hole 8, so that, for example, the respective drains D of the memory cells $M_{n, m}$, and $M_{(n+3), m}$ are connected to the bit line $BL_j$, and the respective drains D of the memory cells $M_{(n+1), m}$, and $M_{(n+2), m}$, are connected to the bit line $BL_{j+1}$. Thus, the memory cells are laid out such that two lengths of the metal interconnections M1 in the first layer are disposed with respect to the cell width $MC_w$, and the cell width $MC_w$ is twice as large as the minimum pitch of the metal interconnections M1.

The metal interconnections M2 in the second layer run along the direction of the channel width, making up the control gate control lines $CG_i$, $CG_{i+1}$, . . . , the memory gate control lines $MG_i$, $MG_{i+1}$, . . . , and the common source lines $SL_i$, $SL_{i+1}$, . . . , respectively. The two memory cells sharing the source S, and disposed at symmetrical positions, such as, for example, the memory cells $M_{n, m}$ and $M_{(n+1), m}$, memory cells $M_{n, (m+1)}$, and $M_{(n+1), (m+1)}$, memory cells $M_{n, (m+2)}$, and $M_{(n+1)}$, memory cells $M_{n, (m+3)}$, and $M_{(n+1), (m+3)}$, . . . , share the control gate control line $CG_i$, the memory gate control line $MG_i$, and the common source line $SL_i$, so that 1.5 lengths of the metal interconnections M2 in the second layer can be disposed with respect to the cell length $MC_L$.

More specifically, the respective control gates CG of a plurality of the memory cells disposed along the direction of the channel width, corresponding to two words (two rows), for example, the memory cells in a n-th row, $M_{n, m}$, $M_{n, (m+1)}$, $M_{n, (m+2)}$, $M_{n, (m+3)}$, . . . , are joined with the respective control gates CG of the memory cells in a (n+1)-th row, $M_{(n+1), m}$, $M_{(n+1), (m+1)}$, $M_{(n+1), (m+2)}$, $M_{(n+1), (m+3)}$, . . . , to be thereby connected to a control gate control line $CG_i$ through the intermediary of a contact hole C1. Similarly, the respective memory gates MG of the plurality of the memory cells disposed along the direction of the channel width, corresponding to the two words (two rows), for example, the respective memory gates MG of the memory cells in a n-th row, $M_{n, m}$, $M_{n, (m+1)}$, $M_{n, (m+2)}$, $M_{n, (m+3)}$, . . . , are joined with the respective memory gates MG of the memory cells in a (n+1)-th row, $M_{(n+1), m}$, $M_{(n+1), (m+1)}$, $M_{(n+1), (m+2)}$, $M_{(n+1), (m+3)}$, . . . , to be connected to the memory gate control line MGi through the intermediary of a contact hole C2. Further, the source S shared by the plurality of the memory cells disposed along the direction of the channel width, corresponding to the two words (two rows), for example, the memory cells in a n-th row, $M_{n, m}$, $M_{n, (m+1)}$, $M_{n, (m+2)}$, $M_{n, (m+3)}$, . . . , and the memory cells in a (n+1)-th row, $M_{(n+1), m}$, $M_{(n+1), (m+1)}$, $M_{(n+1), (m+2)}$, $M_{(n+1), (m+3)}$, . . . , is connected to the common source line SLi through the intermediary of a contact hole C3. Thus, the memory cells are laid out such that the 1.5 lengths of the metal interconnections M2 in the second layer are disposed with respect to the cell length $MC_L$, and the cell length $MC_L$ is 1.5 times as large as the minimum pitch of the metal interconnections M2.

Figure 5:
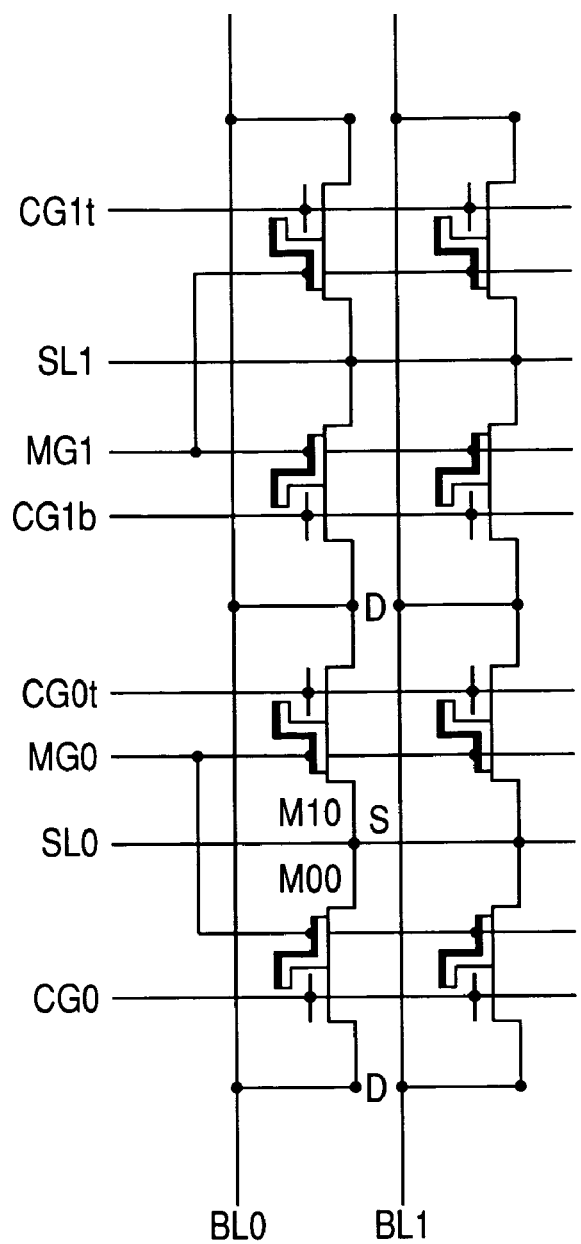
FIG. 5 is an example of a circuit diagram of a NOR memory array as reviewed by the inventors.
Figure 6:
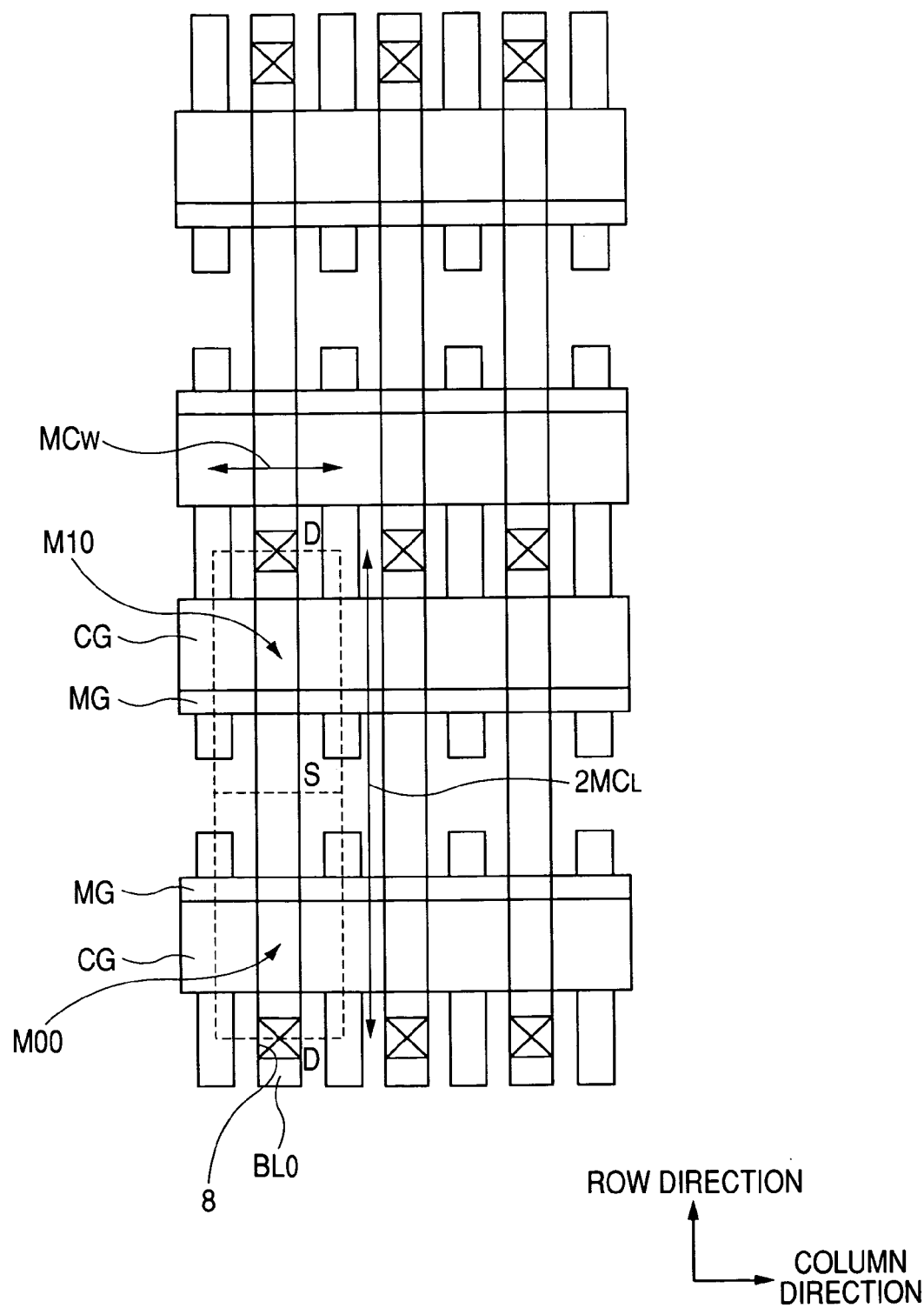
FIG. 6 is an example of a plane layout view of the NOR memory array as reviewed by the inventors.

Next, there is described hereinafter a memory array configuration respective sharing bit lines, as reviewed by the inventors prior to proposing the present invention. FIG. 5 shows an example of a circuit diagram of a NOR memory array comprising two memory cells sharing a source, and disposed at symmetrical positions, and further sharing a bit line, and FIG. 6 shows an example of a plane layout view of the NOR memory array. Herein, a memory array configuration is described by taking two memory cells M00, M10, sharing a source, as an example, however, the same applies to two memory cells sharing a source, other than the two memory cells M00, M10.

As a bit line BL0 is shared by the two memory cells, for example, M00, M10, one length of metal interconnection (the bit line BL0) is disposed with respect to a cell width $MC_w$ of a region (one region delineated by a dotted line in FIG. 6) occupied by one of the memory cells, M00 (or the memory cell M10), so that the cell width $MC_w$ can be rendered to correspond to the minimum pitch of metal interconnections. On the other hand, because a control gate CG cannot be shared, four lengths of metal interconnections (control gate control lines CG0b, CG0t, a memory gate control line MG0, and a common source line SL0) are disposed with respect to a length twice as large as a cell length $MC_L$ of the region (the one region delineated by the dotted line in FIG. 6) occupied by the one of the memory cells, M00 (or the memory cell M10). Accordingly, if control gates CG, memory gates MG, and the source S are all shunted by use of a metal interconnection, respectively, the cell length $MC_L$ needs to have a length corresponding to twice the minimum pitch of the metal interconnections.

Incidentally, with a nonvolatile memory, in order to enhance clock performance by execution of high-speed reading after obtaining a large read-current, and to enhance rewrite reliability by compensating for a decrease in read-current, due to repetition in rewriting storage information, it is necessary to render a channel length as short as possible while concurrently widening a channel width.

With the memory array sharing the bit lines, as shown in FIGS. 5, and 6, since it is not possible to render the cell length $MC_L$ shorter than the length corresponding to twice the minimum pitch of the metal interconnections, as described above, even if the channel length is reduced in order to increase the read-current, this will not lead to reduction in cell size. Further, in order to compensate for a decrease in the read-current, there is no choice but to render the cell width $MC_w$ not less than the minimum pitch of the metal interconnections, thereby resulting in an increase in cell size. In contrast, with the memory array according to Embodiment 1, shown in FIGS. 2 to 4, the cell width $MC_w$ becomes twice as large as the minimum pitch of the metal interconnections, however, the cell length $MC_L$ can be rendered as short as 1.5 times the minimum pitch of the metal interconnections, so that it is possible to increase the read-current while checking an increase in cell size. Hence, the memory array according to Embodiment 1 is considered advantageous to ensure its performance for rewriting storage information, thereby enhancing its rewrite reliability.

Next, with the memory array configuration according to Embodiment 1, there are described hereinafter memory cell operations for erasing, writing, and reading storage information, respectively, by way of example.

In the memory cell operation for erasing storage information, a high voltage (for example, about 12V) is applied to a memory gate control line for a select word, and an erase-select bit line is rendered to be at the circuit ground potential, thereby drawing out electrons accumulated in the charge storage layer into the memory gate. The operation for erasing storage information can be executed in units of the memory gate control line, so that erasing by one operation can be executed for the memory cells corresponding to two words, sharing the memory gate control line for the select word.

In the memory cell operation for writing storage information, a high voltage (for example, about 10V) is applied to a memory gate control line for a select word, and after rendering a select n MIS electrically continuous thereto (for example, a control gate control line for the select word=a select level (for example, about 1.5V)), a high voltage (for example, about 6V) is applied to a common source line for the select word. A predetermined channel current is caused to flow from a power source to a write-select bit line, and electrons are injected in the charge storage layer by injection of hot electrons on the source side, thereby attaining a write condition. A voltage (for example, about 1.5V) is applied to a write-unselect bit line, thereby checking transition to the write condition.

In the memory cell operation for reading storage information, a read-select bit line is pre-charged at, for example, about 1V, and a select n MIS of the memory cell is caused to be electrically continuous to a control gate control line for a select word, at, for example, about 1.5V, thereby detecting a potential of the bit line by a sense amplifier.

Embodiment 1 has thus been described by taking the split gate type memory cell of the MONOS structure as an example of the nonvolatile memory cell, however, the invention can be applied to nonvolatile memory cells other than the above-described memory cell, for example, a split type floating gate memory or one-transistor floating gate memory cell.

Figure 7:
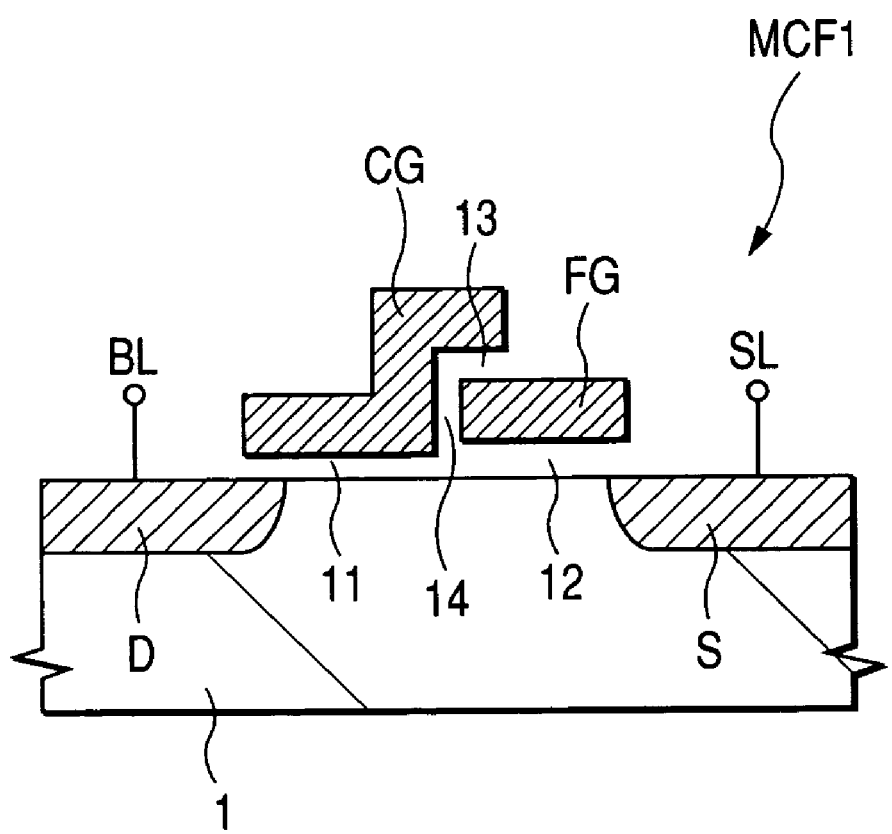
FIG. 7 is an example of a sectional view showing the principal part of another nonvolatile memory cell adopted in the flash memory according to Embodiment 1.
Figure 8:
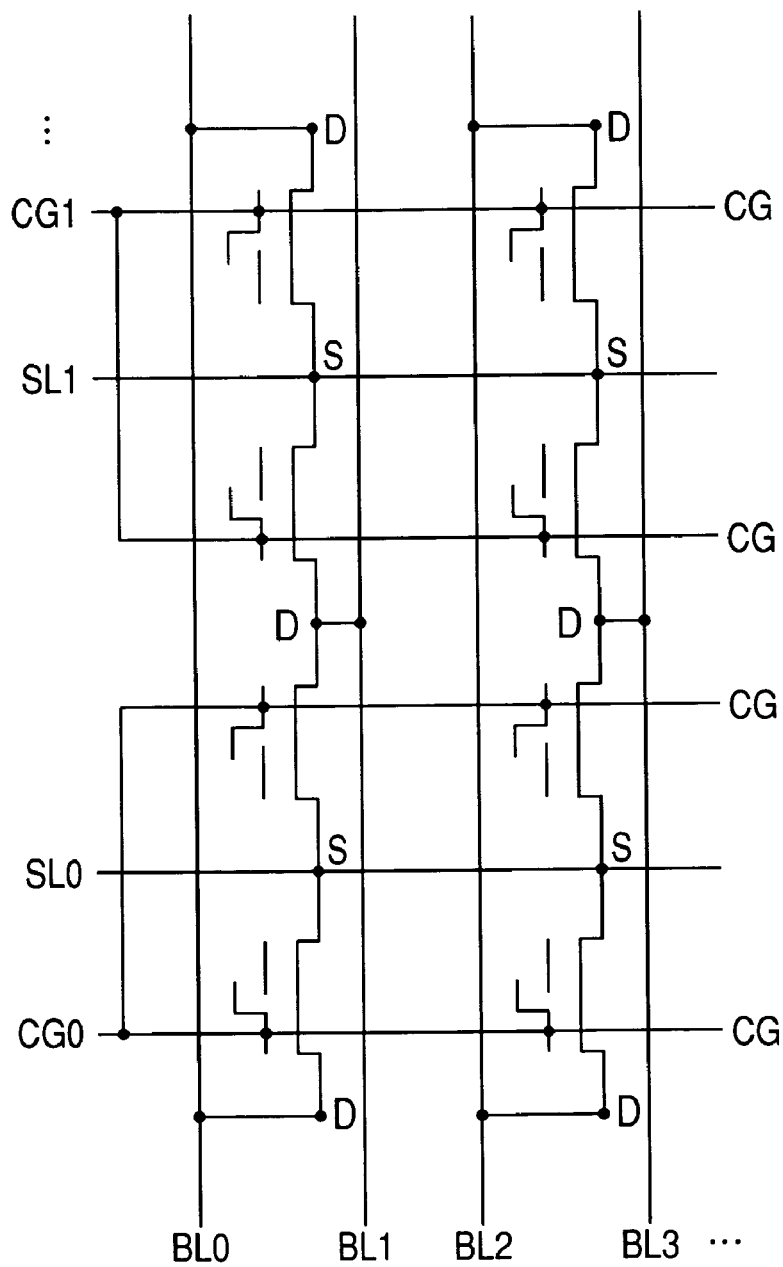
FIG. 8 is an example of a circuit diagram of a NOR memory array in the case of making up the flash memory by use of the nonvolatile memory shown FIG. 7.

FIG. 7 is an example of a sectional view showing the principal part of a split type floating gate memory cell according to Embodiment 1, cut along the direction of a channel length, and FIG. 8 shows an example of a circuit diagram of a NOR memory array wherein the split type floating gate memory cells are adopted.

A split type floating gate memory cell MCF1 is formed in an active region in the top surface of the substrate 1, and a control gate CG and a floating gate FG run in the direction of a channel width, over a portion of the top surface, between a drain D and a source S of the memory cell MCF1, a portion of control gate CG, overlying the floating gate FG. Further, as with the split gate type memory cell MC previously shown in FIG. 2, a plurality of the memory cell MCF1 are adjacent to each other along the direction of the channel width through the intermediary of respective isolation parts formed over the top surface of the substrate 1.

A gate insulator 11 made of, for example, silicon oxide is provided between the control gate CG, and the substrate 1. A tunnel insulating film 12 made of, for example, silicon oxide is provided between the floating gate FG, and the substrate 1. Further, an insulating film 13 made of, for example, silicon oxide is formed on the top face of the floating gate FG, and a sidewall film 14 made of, for example, silicon oxide is formed on a sidewall of the floating gate FG, thereby providing insulation between the control gate CG and the floating gate FG by means of the insulating film 13 and the sidewall film 14. Further, the floating gate FG is formed of an electroconductive film such as for example, a polycrystalline silicon film, or a stacked film composed of the electroconductive film such as, for example, the polycrystalline silicon film, and a silicide layer such as a tungsten silicide (WSi) film, and so forth.

With a memory array configuration using the split type floating gate memory cells MCF1 described, as well, two lengths of metal interconnections (for example, bit lines BL0, BL1, and bit lines BL2 and BL3, . . . ) are disposed with respect to a cell width $MC_W$. Further, the respective control gates CG of the memory cells corresponding to two words are connected to control gate control lines CG0, CG1, running along the direction of the channel width, respectively, so as to be at an identical potential, and respective sources S thereof are connected to common source lines SL0, SL1, running along the direction of the channel width, respectively, so as to be at an identical potential. As the control gate control lines CG0, CG1, . . . , are shared by two memory cells sharing the source S, and disposed at symmetrical positions, respectively, one length of a metal interconnection can be disposed with respect to a cell length $MC_L$. As a result, even in the case where the respective control gates CG, and the respective sources S need to be shunted by a metal interconnection, the cell length $MC_L$ can be reduced to the minimum pitch of the metal interconnections.

Figure 9:
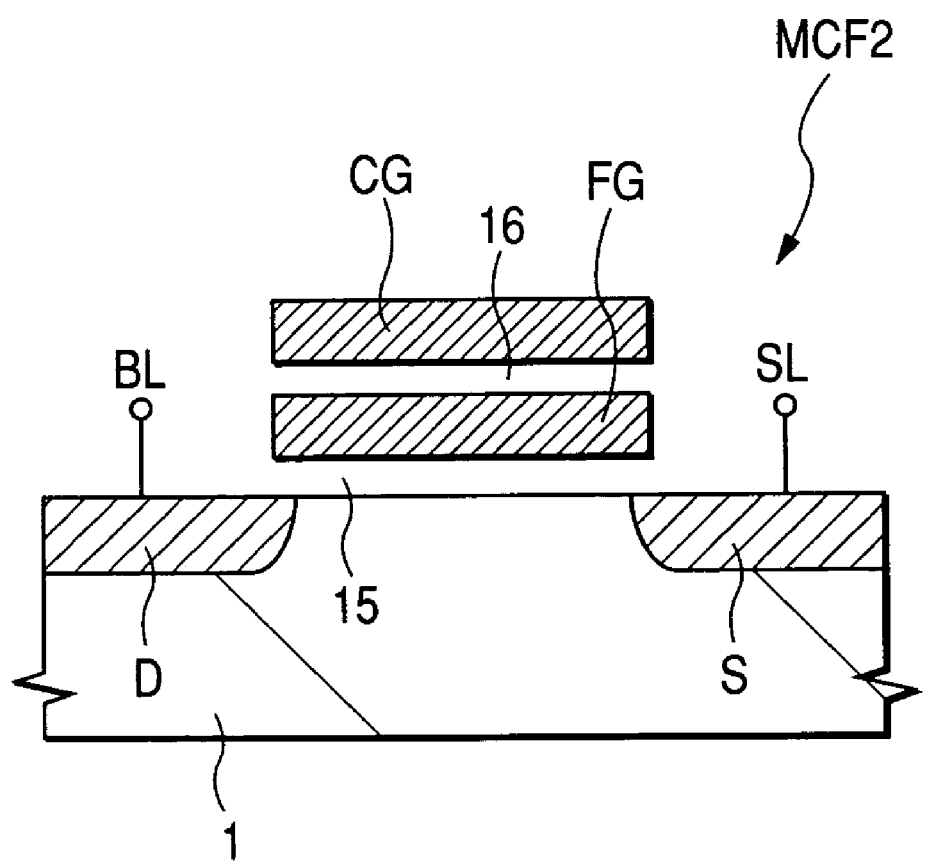
FIG. 9 is an example of a sectional view showing the principal part of still another nonvolatile memory cell adopted in the flash memory according to Embodiment 1.
Figure 10:
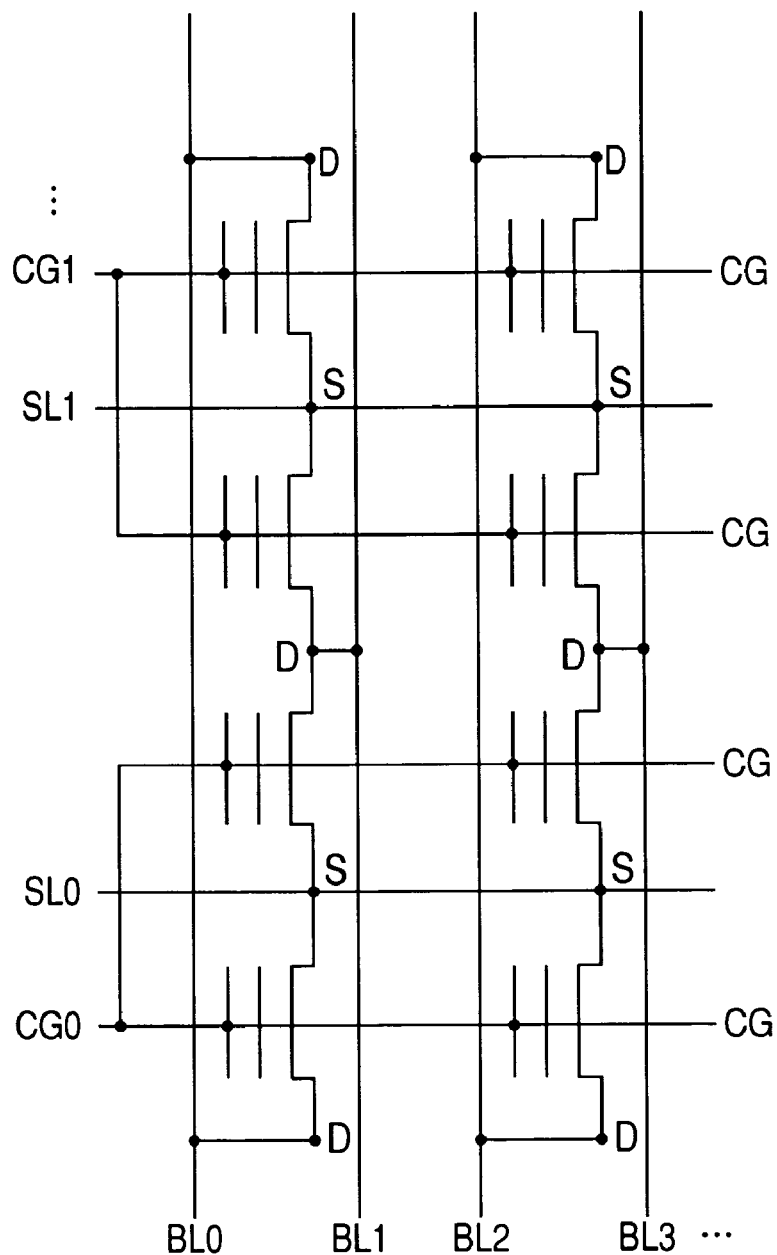
FIG. 10 is an example of a circuit diagram of a NOR memory array in the case of making up the flash memory by use of the nonvolatile memory shown FIG. 9.

FIG. 9 is an example of a sectional view showing the principal part of a one-transistor floating gate memory cell according to Embodiment 1, cut along the direction of a channel length, and FIG. 10 shows an example of a circuit diagram of a NOR memory array wherein the one-transistor floating gate memory cells are adopted.

A one-transistor floating gate memory cell MCF2 is formed in an active region in the top surface of the substrate 1, and a stacked gate composed of a floating gate FG in a lower layer, and a control gate CG in an upper layer run in the direction of a channel width, over a portion of the top surface, between a drain D and a source S of the memory cell MCF2. Further, as with the split gate type memory cell MC previously shown in FIG. 2, a plurality of the memory cell MCF2 are adjacent to each other along the direction of the channel width through the intermediary of respective isolation parts formed over the top surface of the substrate 1.

A tunnel insulating film 15 made of, for example, silicon oxide is provided between the floating gate FG, and the substrate 1. Further, an interlayer dielectric 16 made of, for example, silicon oxide is formed on the upper face of the floating gate FG, and insulation between the control gate CG, and the floating gate FG is provided by means of the interlayer dielectric 16. The floating gate FG is formed of an electroconductive film such as, for example, a polycrystalline silicon film. Further, the control gate CG is formed of an electroconductive film such as, for example, a polycrystalline silicon film, or a stacked film composed of the electroconductive film such as, for example, the polycrystalline silicon film, and a silicide layer such as a tungsten silicide film, and so forth.

With a memory array configuration using the one-transistor floating gate memory cells MCF2 described, as well, two lengths of metal interconnections (for example, bit lines BL0, BL1, and bit lines BL2 and BL3, . . . ) can be disposed with respect to a cell width $MC_W$, and further, as a result of sharing control gate control lines CG0, CG1, . . . , with two memory cells sharing the sources, and disposed at symmetrical positions, respectively, one length of a metal interconnection can be disposed with respect to a cell length $MC_L$. As a result, even in the case where the respective control gates CG, and the respective sources S need to be shunted by a metal interconnection, the cell length $MC_L$ can be reduced to the minimum pitch of the metal interconnections.

Thus, with Embodiment 1, even if the cell width of the memory cell is relatively increased in order to compensate for a decrease in the read-current upon reading storage information, the cell length of the memory cell can be relatively decreased, so that it is possible to enhance reliability in rewriting storage information while checking an increase in memory cell size.

Embodiment 2

With the nonvolatile memory, in order to meet a wish for rewriting storage information so as to correspond to a data length in a necessary processing unit, rewrite of storage information in units of 1 byte has been adopted, however, it is necessary to connect switching elements for dividing the respective bit lines by the byte, and separating the memory cells by the data length in units of 1 byte, so that there exists the problem that an area of a memory array becomes relatively large. Accordingly, the inventors have reviewed a technique (hereinafter referred to as pseudo byte rewrite) whereby storage information is read in units of a word line (one page), such as, for example, in units of 126 bytes (1024 bits), to be thereby latched, and the storage information is written in units of the word line, together with a byte in which storage information is rewritten.

Figure 11:
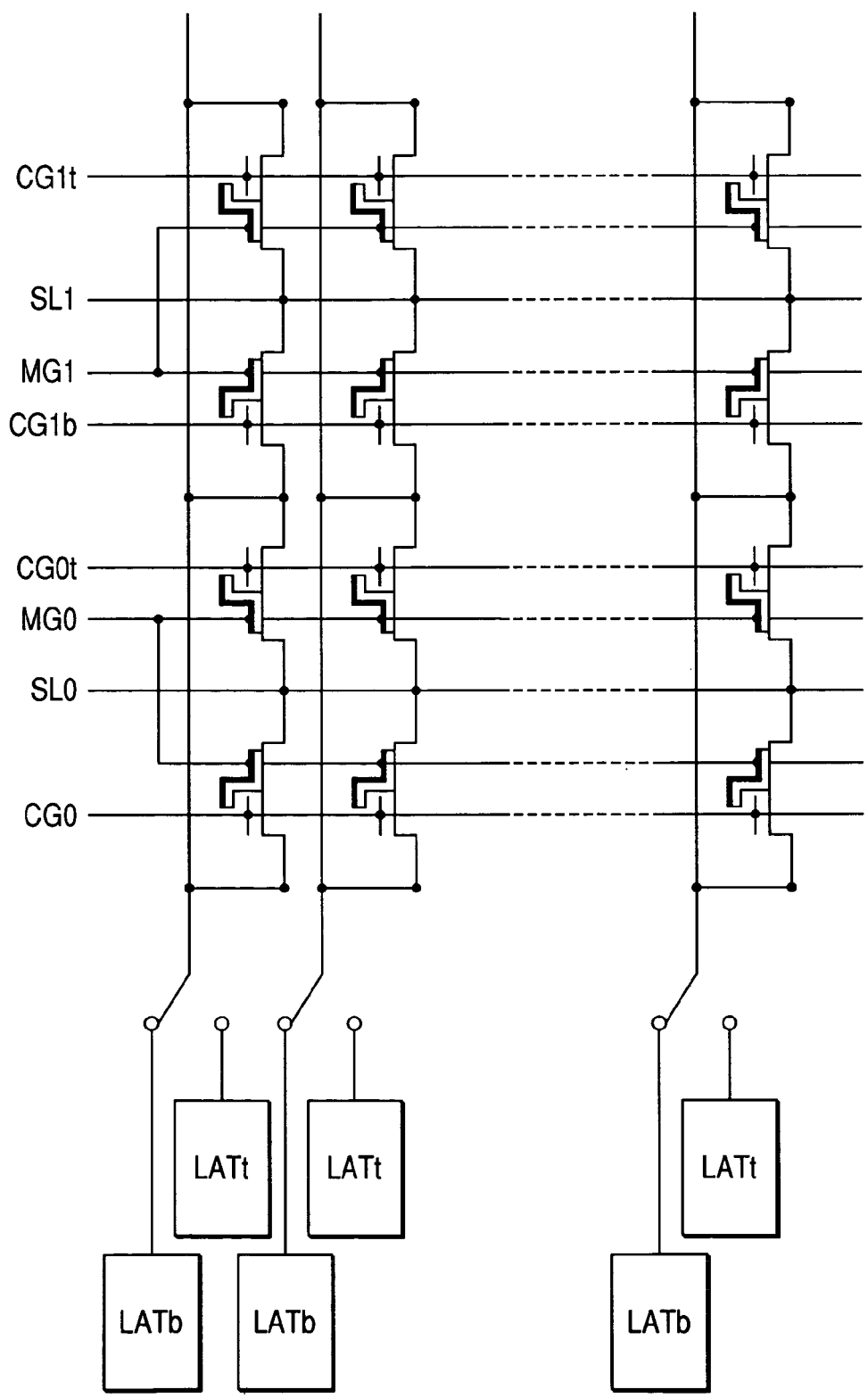
FIG. 11 is an example of a circuit diagram of a NOR memory array as reviewed by the inventors, including latch circuits.
Figure 12:
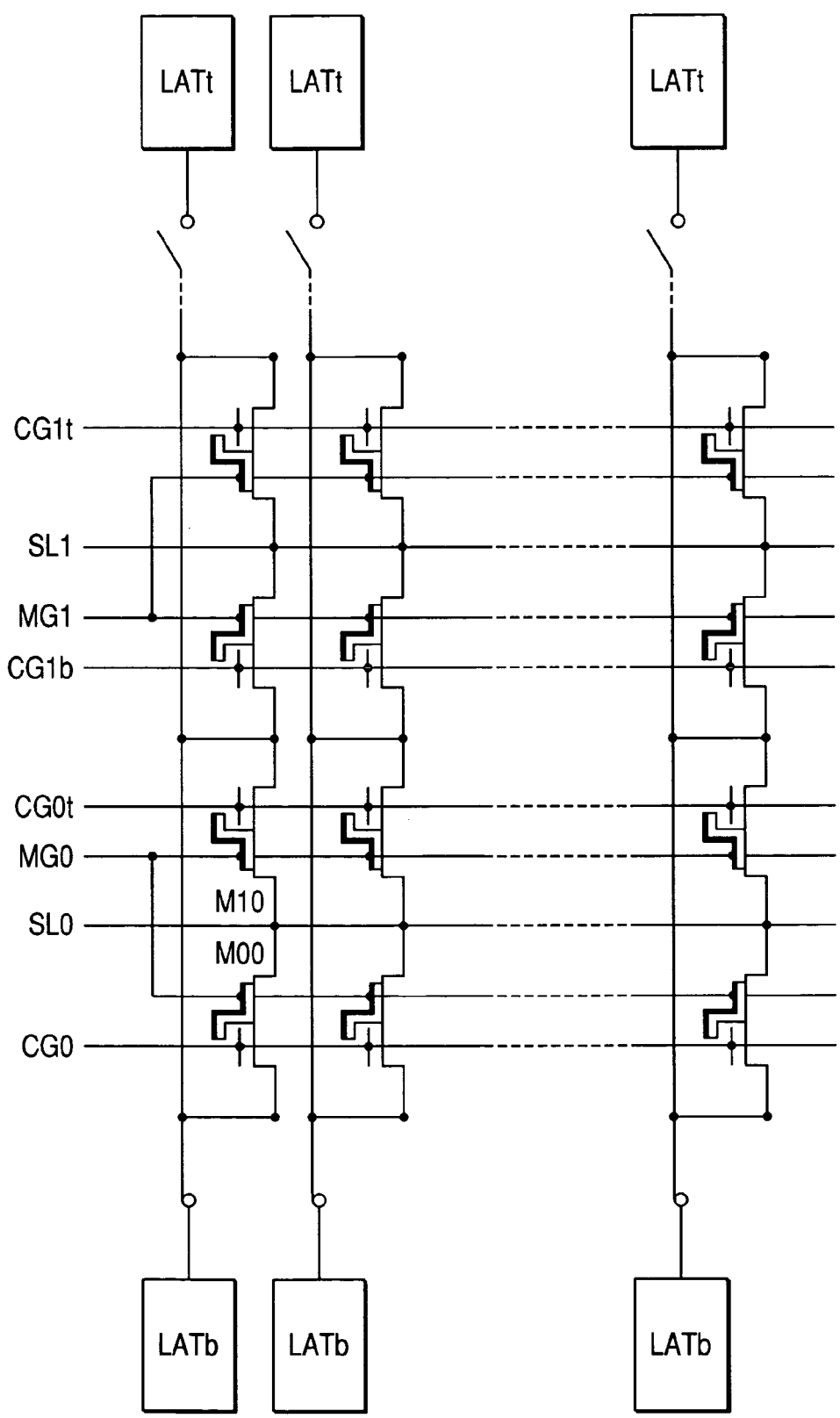
FIG. 12 is another example of a circuit diagram of a NOR memory array as reviewed by the inventors, including latch circuits.
Figure 13:
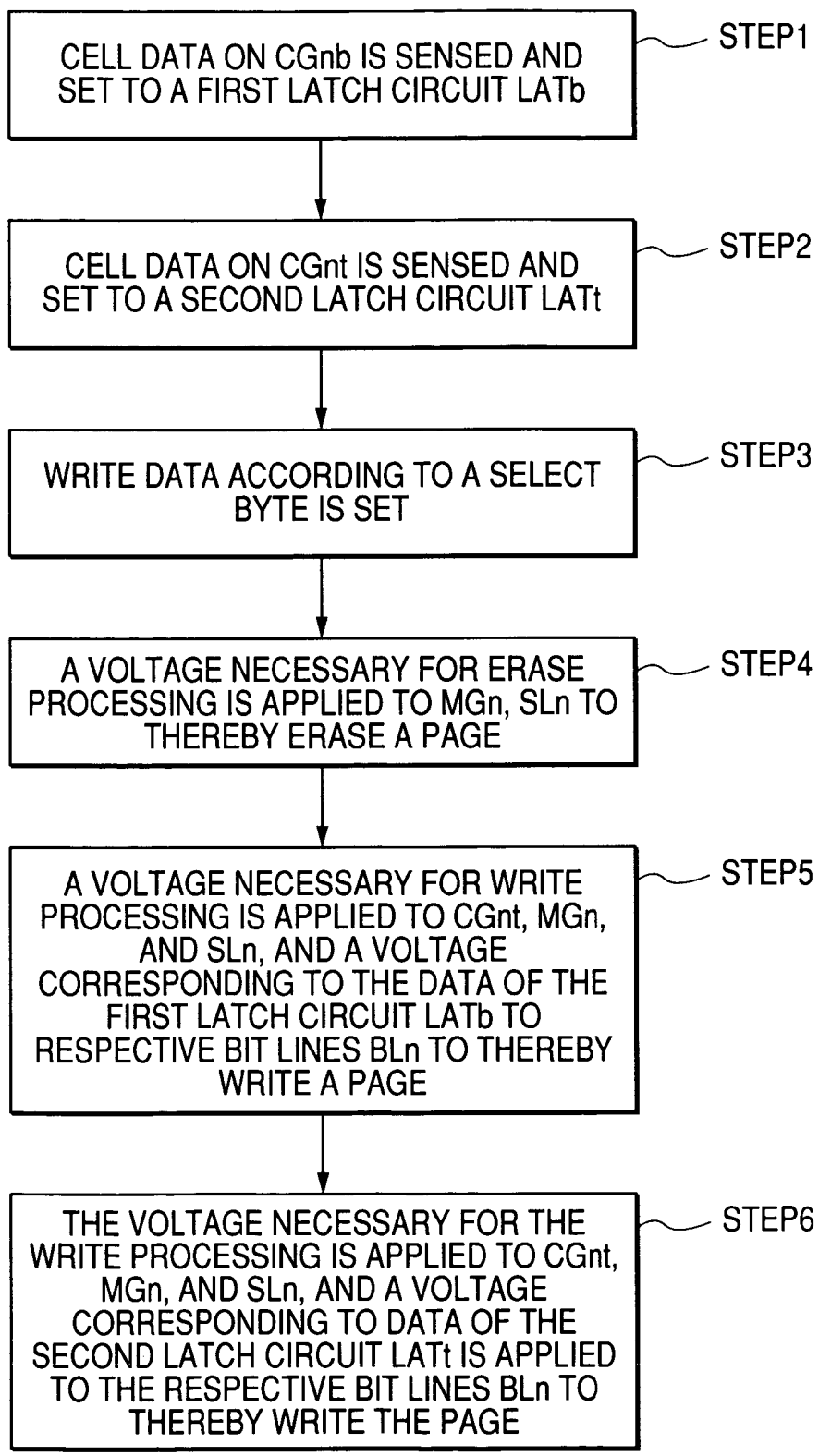
FIG. 13 is an example of a flow sheet showing processing steps for rewrite of storage information in the NOR memory array shown in FIGS. 11 and 12, respectively.

First, there is described hereinafter the case where the pseudo byte rewrite is applied to the NOR memory array comprising the two memory cells sharing the source, and disposed at symmetrical positions, and further sharing the bit line (refer to FIG. 5 previously shown) as reviewed by the inventors. FIGS. 11 and 12 each show an example of a circuit diagram of a NOR memory array making up a flash memory, as reviewed by the inventors, including latch circuits. Further, FIG. 13 shows an example of a flow sheet of processing steps for rewrite of storage information in the NOR memory array shown in FIGS. 11 and 12, respectively.

With the memory cells sharing the source, there is the need for executing the rewrite of storage information in units of two words at the minimum because of disturbance that will be added at the time of rewriting storage information. Accordingly, in the case of the pseudo byte rewrite, storage information corresponding to two words, including a select byte, is all read out for once to be latched, thereby rewriting the storage information corresponding to two words, together with the byte in which the storage information is rewritten.

With the NOR memory array as reviewed by the inventors, the pseudo byte rewrite can be executed by the following processing steps. First, control gate control lines CGnb (for example, control gate control lines CG0b, CG1b, in FIG. 11 or 12) to which first select words in one row are connected are turned into the ON condition, and after storage information of all memory cells (for example, 128 bytes) on the first select words is sensed to be set to a first latch circuit LATb (step1), control gate control lines CGnt (for example, control gate control lines CG0t, CG1t, in FIG. 11 or 12) to which second select words in one row are connected are similarly turned into the ON condition, thereby sensing storage information of all memory cells (for example, 128 bytes) on the second select words to be set to a second latch circuit LATt (step2). Subsequently, after setting a select byte of either the first latch circuit LATb or the second latch circuit LATt according to rewrite data (step 3), a voltage necessary for erase processing is applied to memory gate control lines MGnt (for example, memory gate control lines MG0, MG1, in FIG. 11 or 12), and common source lines SLn (for example, common source lines SL0, SL1, in FIG. 11 or 12), thereby erasing the storage information of all the memory cells on the first and second select words (step4). Then, a voltage necessary for write processing is applied to the control gate control lines CGnb, CGnt, the memory gate control lines MGn, and the common source lines SLn, and after writing storage information to all the memory cells on the first select words by applying a voltage corresponding to data of the first latch circuit LATb to respective bit lines BLn (step 5), the voltage necessary for the write processing is similarly applied to the control gate control lines CGnb, CGnt, the memory gate control lines MGn, and the common source lines SLn while a voltage corresponding to data of the second latch circuit LATt is applied to the respective bit lines BLn, thereby writing storage information to all the memory cells on the second select words (step 6).

Thus, in the case where the pseudo byte rewrite is applied to the NOR memory array sharing the respective bit lines BLn, as shown in FIGS. 11 and 12, it is necessary to prepare two circuits consisting of the first latch circuit LATb, and the second latch circuit LATt per one of the bit lines BLn to thereby read the storage information corresponding to the two words by dividing operation in two cycles, and to write the storage information corresponding to the two words by similarly dividing operation in two cycles, Consequently, much time is required in rewriting storage information, and because circuit control becomes complex, a peripheral circuit will increase in size.

Figure 14:
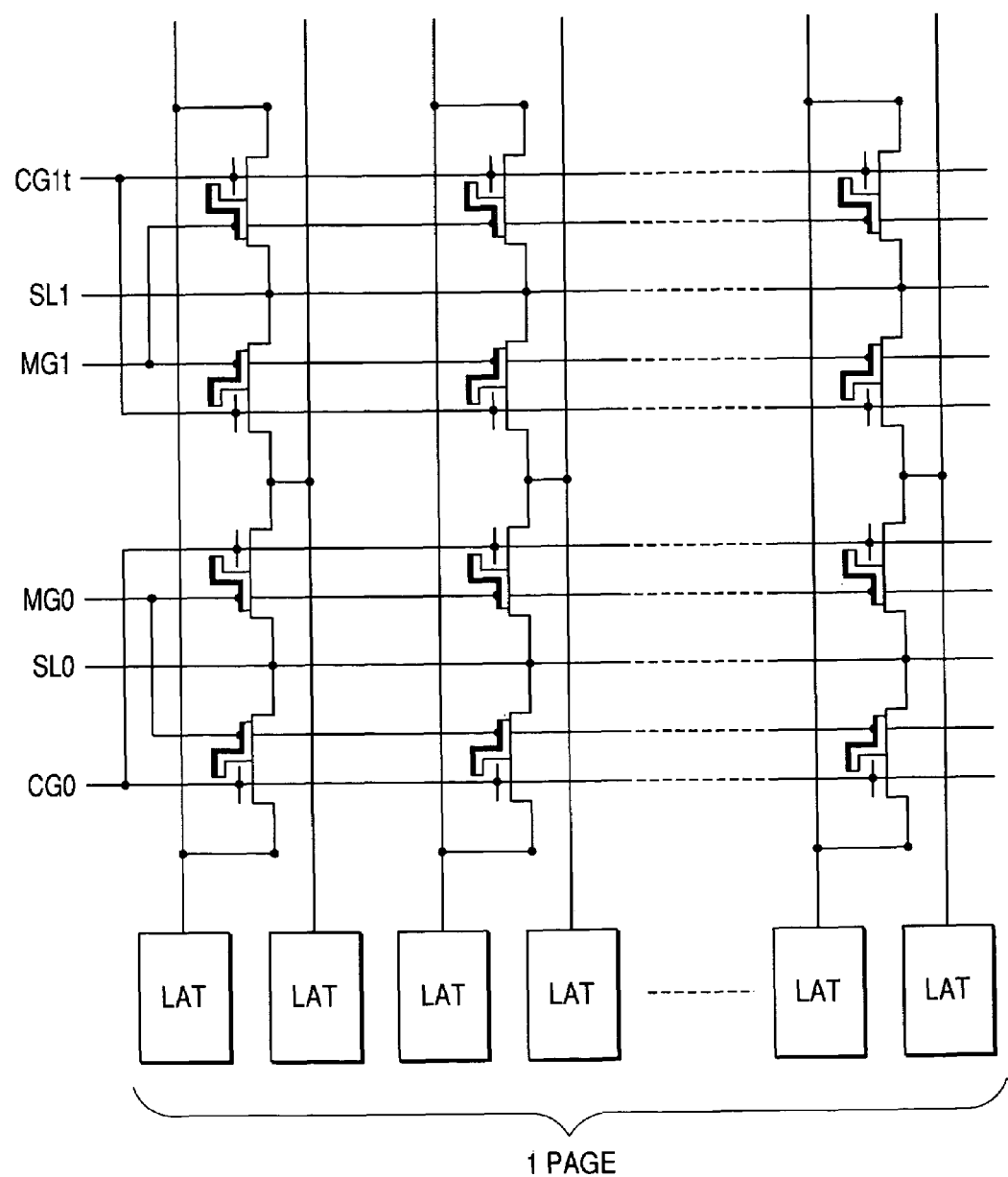
FIG. 14 is an example of a circuit diagram of a NOR memory array according to Embodiment 2, including latch circuits.
Figure 15:
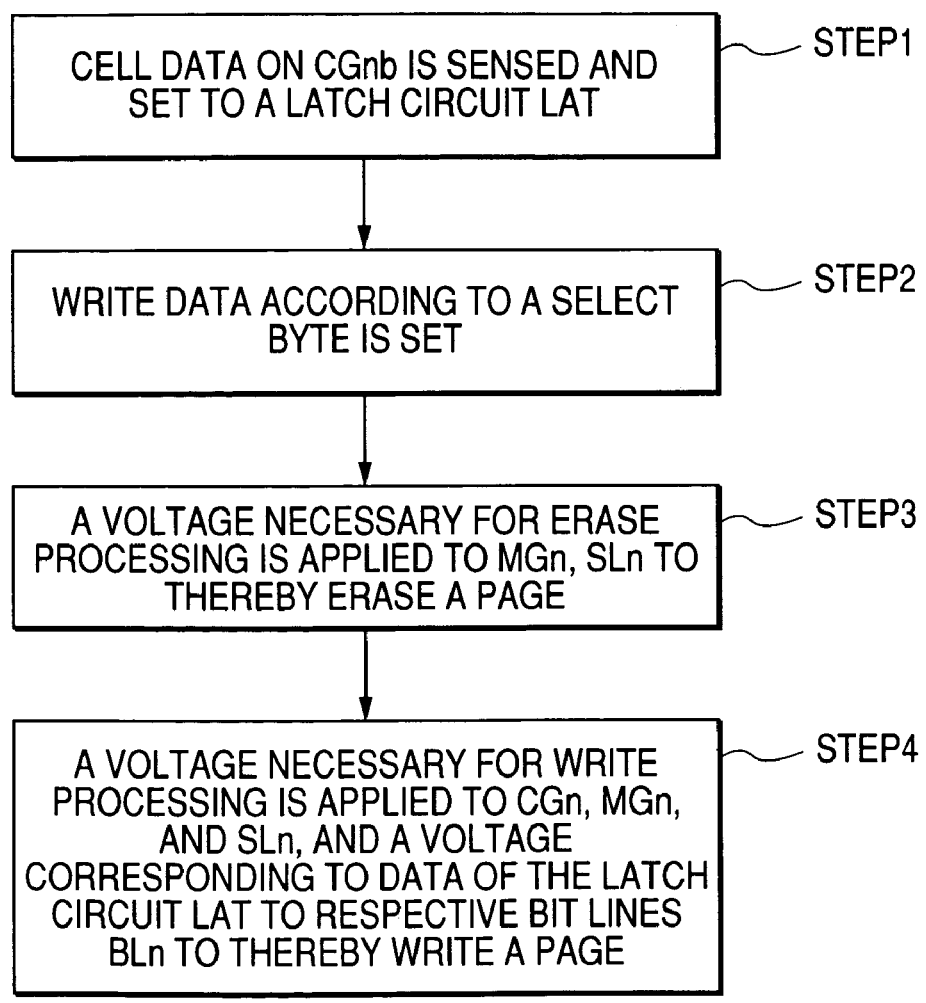
FIG. 15 is an example of a flow sheet of processing steps for rewrite of storage information in the NOR memory array shown in FIG. 14.

Next, there is described hereinafter the case where the pseudo byte rewrite is applied to the NOR memory array made up of the two memory cells sharing the source, and disposed at symmetrical positions, according to Embodiment 1 (refer to FIG. 2 as previously shown). FIG. 14 shows an example of a circuit diagram of a NOR memory array making up a flash memory according to Embodiment 2, including latch circuits. FIG. 15 shows an example of a flow sheet of processing steps for rewrite of storage information in the NOR memory array shown in FIG. 14.

With the NOR memory array according to Embodiment 2, the pseudo byte rewrite can be executed by the following processing steps. First, control gate control lines CGn (for example, control gate control lines CG0, CG1, in FIG. 14) with first and second select words, connected thereto, respectively, are turned into the ON condition, and storage information of all memory cells on the first and second select words is sensed to be set to the latch circuit LAT (step 1). Subsequently, after setting a select byte in the latch circuit LAT according to rewrite data (step 2), a voltage necessary for erase processing is applied to memory gate control lines MGn (for example, memory gate control lines MG0, MG1, in FIG. 14), and common source lines SLn (for example, common source lines SL0, SL1, in FIG. 14), thereby erasing the storage information of all the memory cells on the first and second select words (step 3). Then, a voltage necessary for write processing is applied to the control gate control lines CGn, the memory gate control lines MGn, and the common source lines SLn, and a voltage corresponding to the data of the latch circuit LAT is applied to respective bit lines BLn, thereby writing storage information to all the memory cells on the first and second select words (step 4).

Thus, in the case where the pseudo byte rewrite is applied to the NOR memory array shown in FIG. 14, comprising the memory cells without sharing the respective bit lines BLn, it is possible to concurrently read, and write storage information for two words by providing the respective bit lines BLn with one latch circuit LAT. Accordingly, with the memory cells sharing the source S, disposed on two words, taken as one page, page rewrite can be executed by one operation.

A high voltage applied at the time of the rewrite is against the common source lines SLn, and the memory gate control lines MGn of a select page only, and the high voltage is not applied to the memory cells on unselect pages. Consequently, rewrite disturbance does not occur to the memory cells on the unselect pages, thereby enabling page rewrite by one operation to be implemented. Further, the respective bit lines BLn are independently connected to all the memory cells on one page (two words), and read or write can be executed by one operation, so that time for rewriting storage information can be rendered shorter than that for the case where the pseudo byte rewrite is applied to the NOR memory array described with reference to previously shown FIGS. 11 and 12. In addition, since there is no need for dually providing the latch circuit LAT for latching, and writing back storage information corresponding to one page (two words), circuit control becomes simpler, so that a peripheral circuit can be rendered smaller in size than that for the case where the pseudo byte rewrite is applied to the NOR memory array described with reference to previously shown FIGS. 11 and 12.

Figure 16:
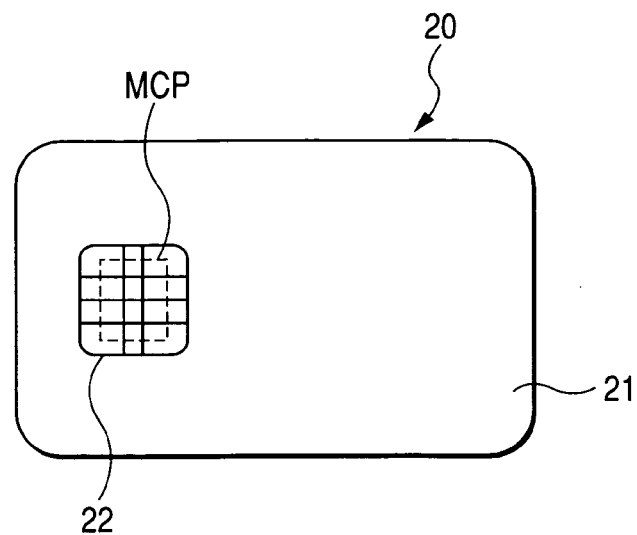
FIG. 16 is an example of an external view showing an IC card of a contact interface style, with the nonvolatile memory according to Embodiment 2 mounted therein.
Figure 17:
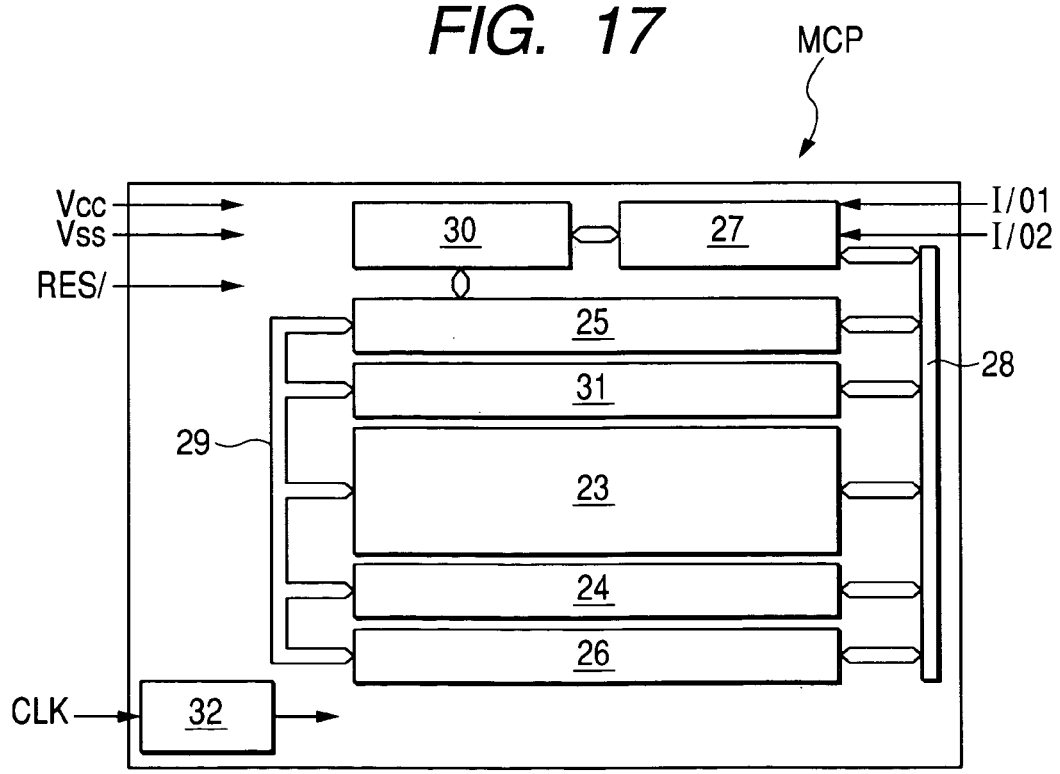
FIG. 17 is an example of a block diagram of a microcomputer comprising the nonvolatile memory according to Embodiment 2, embedded in the IC card.

Now, there is described hereinafter an IC card with the nonvolatile memory according to Embodiment 2 mounted therein. FIG. 16 is an example of an external view showing an IC card of a contact interface style, and FIG. 17 is an example of a block diagram of a microcomputer embedded in the IC card.

An IC card 20 comprises a card substrate 21 made of a synthetic resin, and a microcomputer MCP embedded therein. There is no particular limitation to the card substrate 21, however, a terminal 22 formed by an electrode pattern is exposed to the surface of the card substrate 21, and an external terminal corresponding to the microcomputer MCP is joined with the electrode pattern.

The microcomputer MCP is called, for example, an IC micon, and is formed on a single semiconductor substrate made of single crystal silicon, and so forth, or a semiconductor chip, by use of a technology for manufacturing a semiconductor integrated circuit such as, for example, a CMOS (Complementary Metal Oxide Semiconductor) device. The microcomputer MCP comprises a nonvolatile memory module 23, a RAM (Random Access Memory) 24, a CPU 25, a co-processor 26, an input/output port 27, a data bus 28, an address bus 29, a system control unit 30, and so forth.

The nonvolatile memory module 23 is used for storing an encryption key used for encryption of input/output data, or data such as ID (Identification Data) information used for specifying individuals, and programs and so forth to be processed by the CPU, and is composed of a flash memory having, for example, the memory array previously shown in FIG. 14. With the flash memory, the page rewrite by one operation is executed by taking memory cells disposed on two words, as one page.

The RAM 24 is a work region of the CPU, and is comprised of, for example, a SRAM (Static Random Access Memory), or a DRAM (Dynamic Random Access Memory). The CPU 25 fetches an instruction from the nonvolatile memory module, and decodes the instruction as fetched, thereby executing operand fetch or data operation on the basis of the results of decoding. The co-processor 26 is a processor unit for executing extra multiplication operation, and so forth in an RSA encryption operation or elliptic curve encryption operation on behalf of the CPU. The input/output port 27 has input/output terminals for 2 bits, serving dual purposes for input/output of storage information, and input of an external interrupt signal. The input/output port is joined with the data bus 28, and the data bus 28 is connected with the CPU 25, a timer 31, the nonvolatile memory module 23, the RAM 24, and the co-processor 26, respectively. In the microcomputer MCP, the CPU 25 acts as a bus master module, enabling an address signal to be sent out to an address bus 29 connected to the timer 31, the nonvolatile memory module 23, the RAM 24, and the co-processor 26, respectively. The system control unit 30 executes operation-mode control, and interrupt-operation control, having a random number generation logic device for use in generation of the encryption key.

Further, RES/refers to a reset signal for the microcomputer MCP. When a reset operation is directed by the reset signal RES/, the microcomputer MCP undergoes internal initialization, whereupon the CPU 25 starts execution of the instruction from the leading address in a program of the nonvolatile memory module 23. A clock generation circuit generates an internal clock signal CK upon receiving an external clock signal CLK. The microcomputer MCP is operated in sync with the internal clock signal CK.

The CPU 25 is, for example, a 32-bit RISC (Reduced Instruction Set Computer) capable of processing in units of 32 bits, comprising a general purpose register for 32 bits, an arithmetic logic unit for 32 bits, and so forth, thereby rendering the data bus 28 based on 32 bits. Consequently, data transmission instructions, and processing instructions, contained in an instruction set of CPU 25, are mostly in units of 32 bits, on which storage information is processed.

With Embodiment 2, there has been described the case of the nonvolatile memory being applied to the IC card of the contact interface style, however, the invention can be applied to an IC card of an contactless interface style, with, for example, an antenna and the microcomputer MCP, embedded therein.

Thus, with Embodiment 2, since all the memory cells sharing the source, and disposed on two words can be rewritten by one operation, rewrite time for storage information of the nonvolatile memory can be rendered relatively short. Further, since the number of the latch circuits provided for the respective bit lines can be decreased to one, circuit control becomes simpler, so that the peripheral circuit of the nonvolatile memory can be rendered relatively small in size. Still further, by mounting the nonvolatile memory described as above in a semiconductor device such as, for example, the module, it becomes possible to provide a microcomputer capable of attaining a higher operating speed, and miniaturization and consequently, an IC card.

Having specifically described the invention developed by the inventors with reference to the embodiments of the invention, it is to be understood that the invention is not limited thereto, and it is obvious that various changes and modifications may be made in the invention without departing from the spirit and scope thereof.

With the embodiments described hereinbefore, there have been described the cases where the invention is applied to the nonvolatile memory cell adopting the flash memory, however, the invention can be applied to, for example, a pseudo byte rewrite type EEPROM as well. Further, a length of data disposed on a word line of a memory array has been set to correspond to 1024 bits, however, the invention is not limited thereto, and the length of the data may be set to correspond to 32 bit, and so forth.

Thus, the present invention can be put into widespread use for the microcomputer, the IC card, and so forth.

What is claimed is:

1. A semiconductor device having a memory array in which a plurality of nonvolatile memory cells are arranged in a two-dimensional grid pattern, the memory array comprising:

a first nonvolatile memory cell having a first charge storage layer, and a second nonvolatile memory cell having a second charge storage layer, said first and second nonvolatile memory cells being disposed adjacent to each other at symmetrical positions along a first direction;

a source line electrically connected to a source of the first nonvolatile memory cell and a source of the second nonvolatile memory cell;

a first bit line electrically connected to a drain of the first nonvolatile memory cell;

a second bit line electrically connected to a drain of the second nonvolatile memory cell and having no direct electrical connection to the first bit line;

a first gate of the first nonvolatile memory cell extending along a second direction perpendicular to the first direction; and a second gate of the second nonvolatile memory cell extending along the second direction.

2. A semiconductor device according to claim 1, wherein the first and second bit lines are disposed along the first direction.

3. A semiconductor device according to claim 1, wherein the memory array is of a NOR type.

4. A semiconductor device according to claim 1, wherein a first latch circuit is connected to the first bit line and a second latch circuit is connected to the second bit line.

5. A semiconductor device according to claim 1,
wherein each of the first gate of the first nonvolatile memory cell and the second gate of the second nonvolatile memory cell comprises a control gate and a memory gate, and
wherein the control gate of the first nonvolatile memory cell is rendered identical in potential to the control gate of the second nonvolatile memory cell while the memory gate of the first nonvolatile memory cell is rendered identical in potential to the memory gate of the second nonvolatile memory cell.

6. A semiconductor device according to claim 5, further comprising:
a first gate control line electrically connected to the control gate of the first nonvolatile memory cell and the control gate of the second nonvolatile memory cell; and
a second gate control line electrically connected to the memory gate of the first nonvolatile memory cell and the memory gate of the second nonvolatile memory cell;
wherein the first and second bit lines are disposed along the first direction, and the first gate control line, the second gate control line, and the source line are disposed along the second direction.

7. A semiconductor device according to claim 6,
wherein the first and second bit lines are formed of a metal interconnection in a first layer, while the first gate control line, the second gate control line, and the source line are formed of a metal interconnection in a second layer.

8. A semiconductor device according to claim 1, wherein each of the first and second charge storage layers is made of a polycrystalline silicon film.

9. A semiconductor device according to claim 8, wherein the first charge storage layer is formed over a side wall of the first gate, and wherein the second charge storage layer is formed over a side wall of the second gate.

10. A semiconductor device according to claim 1, wherein each of the first and second charge storage layers is made of a silicon nitride film.

11. A semiconductor device according to claim 10,
wherein each of the first gate of the first nonvolatile memory cell and the second gate of the second nonvolatile memory cell comprises a control gate and a memory gate,
wherein, in the first nonvolatile memory cell, the first charge storage layer is formed over a side wall of the control gate and between the memory gate and a semiconductor substrate, and
wherein, in the second nonvolatile memory cell, the second charge storage layer is formed over a side wall of the control gate and between the memory gate and the semiconductor substrate.

12. A semiconductor device according to claim 11, wherein the control gates and the memory gates extend along the second direction.

13. A semiconductor device having a memory array including a plurality of nonvolatile memory cells, the memory array comprising:
first, second, third and fourth nonvolatile memory cells having first, second, third and fourth charge storage layers, respectively, said first, second, third and fourth nonvolatile memory cells being disposed along a first direction;
a first bit line extending along the first direction;
first and second source lines extending along a second direction perpendicular to the first direction; and
first, second, third and fourth gates extending along the second direction;
wherein the memory array further comprises a second bit line extending along the first direction,
wherein the second nonvolatile memory cell is adjacent to the first and third nonvolatile memory cells,
wherein the third nonvolatile memory cell is adjacent to the second and fourth nonvolatile memory cells,
wherein the first, second, third and fourth nonvolatile memory cells include the first, second, third and fourth gates, respectively,
wherein the first source line is electrically connected to sources of the first and second nonvolatile memory cells,
wherein the second source line is electrically connected to sources of the third and fourth nonvolatile memory cells,
wherein the first bit line is electrically connected to drains of the second and third nonvolatile memory cells, and
wherein the second bit line is electrically connected to drains of the first and fourth nonvolatile memory cells, and the second bit line has no direct electrical connection to the first bit line.

14. A semiconductor device according to claim 13, wherein each of the first, second, third and fourth charge storage layers is made of a polycrystalline silicon film.

15. A semiconductor device according to claim 14,
wherein the first charge storage layer is formed over a side wall of the first gate,
wherein the second charge storage layer is formed over a side wall of the second gate,
wherein the third charge storage layer is formed over a side wall of the third gate, and
wherein the fourth charge storage layer is formed over a side wall of the fourth gate.

16. A semiconductor device according to claim 14,
wherein the first gate is rendered identical in potential to the second gate, and
wherein the third gate is rendered identical in potential to the fourth gate.

17. A semiconductor device according to claim 13,
wherein each of the first, second, third and fourth charge storage layers is made of a silicon nitride film.

18. A semiconductor device according to claim 17,
wherein each of the first gate, the second gate, the third gate, and the fourth gate comprises a control gate and a memory gate,
wherein, in the first nonvolatile memory cell, the first charge storage layer, is formed over a side wall of the control gate and between the memory gate and a semiconductor substrate,
wherein, in the second nonvolatile memory cell, the second charge storage layer is formed over a side wall of the control gate and between the memory gate and the semiconductor substrate,
wherein, in the third nonvolatile memory cell, the third charge storage layer is formed over a side wall of the control gate and between the memory gate and the semiconductor substrate, and
wherein, in the fourth nonvolatile memory cell, the fourth charge storage layer is formed over a side wall of the control gate and between the memory gate and the semiconductor substrate.

19. A semiconductor device according to claim 18,
wherein the control gate of the first nonvolatile memory cell is rendered identical in potential to the control gate of the second nonvolatile memory cell,
wherein the control gate of the third nonvolatile memory cell is rendered identical in potential to the control gate of the fourth nonvolatile memory cell,
wherein the memory gate of the first nonvolatile memory cell is rendered identical in potential to the memory gate of the second nonvolatile memory cell, and
wherein the memory gate of the third nonvolatile memory cell is rendered identical in potential to the memory gate of the fourth nonvolatile memory cell.

20. A semiconductor device according to claim 13,
wherein the memory array is of a NOR type.

* * * * *